United States Patent
Hoppe et al.

(10) Patent No.: US 9,169,547 B2
(45) Date of Patent: Oct. 27, 2015

(54) GLIDING ELEMENT

(75) Inventors: Steffen Hoppe, Overath (DE); Manfred Fischer, Leichlingen (DE); Marcus Kennedy, Dusseldorf (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 401 days.

(21) Appl. No.: 13/321,261

(22) PCT Filed: Feb. 24, 2010

(86) PCT No.: PCT/EP2010/052320
§ 371 (c)(1),
(2), (4) Date: Nov. 18, 2011

(87) PCT Pub. No.: WO2010/133384
PCT Pub. Date: Nov. 25, 2010

(65) Prior Publication Data
US 2012/0068418 A1    Mar. 22, 2012

(30) Foreign Application Priority Data
May 19, 2009  (DE) .......... 10 2009 003 232

(51) Int. Cl.
*F16J 9/26*    (2006.01)
*C23C 14/06*    (2006.01)

(52) U.S. Cl.
CPC ............... *C23C 14/0605* (2013.01); *F16J 9/26* (2013.01)

(58) Field of Classification Search
USPC .......... 277/442, 443, 444; 428/216, 336, 697, 428/698; 427/570, 569, 249.1
See application file for complete search history.

(56) References Cited

U.S. PATENT DOCUMENTS

| | | | | |
|---|---|---|---|---|
| 4,681,817 A | * | 7/1987 | Shinada | 277/442 |
| 5,104,132 A | * | 4/1992 | Onoda et al. | 277/443 |
| 5,154,433 A | * | 10/1992 | Naruse | 277/443 |
| 5,601,293 A | * | 2/1997 | Fukutome et al. | 277/443 |
| 6,022,175 A | * | 2/2000 | Heinrich et al. | 407/119 |
| 6,110,329 A | * | 8/2000 | Holleck et al. | 204/192.15 |
| 6,395,108 B2 | * | 5/2002 | Eberle et al. | 148/330 |
| 6,528,115 B1 | | 3/2003 | Hirano et al. | |
| 6,555,241 B1 | * | 4/2003 | Erbsloh et al. | 428/472 |
| 6,656,293 B2 | * | 12/2003 | Black et al. | 148/219 |
| 7,244,493 B2 | * | 7/2007 | LaBarge et al. | 428/336 |
| 7,255,083 B2 | * | 8/2007 | Hamada et al. | 123/193.4 |

(Continued)

FOREIGN PATENT DOCUMENTS

| | | |
|---|---|---|
| DE | 102005063123 B3 | 5/2007 |
| WO | 9749840 A1 | 12/1997 |
| WO | 2007020139 A1 | 2/2007 |
| WO | WO2007079834 A1 | 7/2007 |

OTHER PUBLICATIONS

Teo E H T et al. "Mechanical Properties of gradient pulse biased amorphous carbon film," Thin Solid Films, Elsevier-Sequoia S.A. Lausanne, Bd. 516, Nr. 16, Jun. 30, 2008, pp. 5364-5367.

(Continued)

*Primary Examiner* — Kristina Fulton
*Assistant Examiner* — Eugene G Byrd
(74) *Attorney, Agent, or Firm* — Robert L. Stearns; Dickinson Wright, PLLC

(57) ABSTRACT

The invention relates to a gliding element of an internal combustion engine, especially a piston ring, having a DLC coating of the ta-C type which has at least one residual stress gradient.

17 Claims, 1 Drawing Sheet

(56) References Cited

U.S. PATENT DOCUMENTS

| | | | |
|---|---|---|---|
| 7,354,629 B2 * | 4/2008 | Nagata | 427/525 |
| 7,771,798 B1 | 8/2010 | Grosse et al. | |
| 7,793,940 B2 * | 9/2010 | Martin | 277/370 |
| 7,871,078 B2 * | 1/2011 | Fischer et al. | 277/442 |
| 7,879,443 B2 * | 2/2011 | Endrino | 428/408 |
| 7,960,016 B2 * | 6/2011 | Lechthaler et al. | 428/217 |
| 8,007,922 B2 * | 8/2011 | Mirchandani et al. | 428/548 |
| 2005/0005892 A1 | 1/2005 | Nishimura et al. | |
| 2005/0218603 A1 * | 10/2005 | Fischer | 277/443 |
| 2006/0024140 A1 * | 2/2006 | Wolff et al. | 408/1 R |
| 2008/0292812 A1 | 11/2008 | Ramm et al. | |
| 2009/0001669 A1 | 1/2009 | Hoppe et al. | |
| 2009/0011225 A1 | 1/2009 | Moronuki et al. | |
| 2012/0052326 A1 * | 3/2012 | Kobayashi et al. | 428/697 |
| 2012/0126488 A1 * | 5/2012 | Avelar Arajo | 277/443 |

OTHER PUBLICATIONS

Sheeja D et al: "Structural and tribological characterization of multilayer Ta-C films prepared by filtered cathodic vacuum arc with substrate pulse biasing," Surface and Coatings Technology Elsevier Switzerland, vol. 132, Nr. 2-3, Oct. 23, 2000, pp. 228-232.

Spaeth C et al: "Mechanical properties of carbon nitride thin films prepared by ion beam assisted filtered cathodic vacuum arc deposition," Surface and Coatings Technology Elsevier Switzerland, vol. 112, Nr. 1-3, Feb. 1999, pp. 140-145.

Robertson J: "Diamond-like amorphous carbon," Materials Science and Engineering R: Reports, Elsevier Sequoia S.A., Lausanne, vol. 37, Nr. 4-6, May 24, 2002, pp. 129-281.

* cited by examiner

GLIDING ELEMENT

BACKGROUND OF THE INVENTION

1. Technical Field

The invention relates to a sliding element in an internal combustion engine, especially a piston ring.

When reducing the carbon dioxide emissions of internal combustion engines the fuel consumption plays an essential role. This is affected essentially by the friction losses in the engine, in particular in the area of the pistons, for example on the piston rings. There is therefore a requirement for sliding elements in internal combustion engines, especially piston rings, which have the most favourable possible friction characteristics over their whole life span. With regard to the whole life span, the running-in characteristics, any possible lubrication deficiency and any burn mark formation, which respectively lead to changed tribological properties, are to be taken into account.

2. Related Art Prior Art

In the aforementioned Technical field PVD coatings on a hard material base are known which have good resistance to wear, but are in need of improvement with regard to the friction coefficients.

A layer structure emerges from DE 10 2005 063 123 B3 which, from the outside to the inside, has a running-in layer, an adhesive layer and a wear protection layer. However, the characteristics of the friction properties over the life span have proven to still be capable of improvement.

SUMMARY OF THE INVENTION

A sliding element of an internal combustion engine, in particular a piston ring, has a coating which reliably has favourable friction properties over the longest period of time possible.

Therefore, the latter has a DLC coating of the ta-C type which has changing residual stresses over its thickness. In other words, at least one residual stress gradient is formed over the thickness of the coating. As is known, "DLC" stands for Diamond-Like Carbon. The ta-C type is characterised by a tetrahedral structure, is free from hydrogen and is defined, for example, in VDI guideline 2840. This type of layer provides on the one hand good friction characteristics, and moreover, for the following reasons has a particularly long life span.

On the one hand the variation in residual stresses over the thickness of the layer makes it possible to produce large layer thickness, for example greater than 10 µm, without problems occurring with regard to the adhesion or brittleness of the layer. Specifically, one has been able to establish that, for example, zones with low layer residual stresses relax or relieve the whole layer composite, i.e. the in particular multi-layered coating provided, locally. In this way, with high thrust load stresses, as occur when used in an internal combustion engine, the elastic limit of the DLC coating is not exceeded. Accordingly, the wear of the coating can be successfully limited.

For the cross-over from the coating to the base material of the sliding element a negative residual stress gradient in this, i.e. an inner region of the coating, as viewed from the outside to the inside, has proved to be advantageous. In other words, the residual stresses decrease towards the base material to a low value so as to achieve a favourable stress cross-over to the base material and good adhesion of the layer.

For a region lying to the outside a positive residual stress gradient, as viewed from the outside to the inside, has proved to be advantageous. In other words, the residual stress lies on the outer surface of the coating on a comparably low level, and this has proved to be advantageous for favourable running-in characteristics. From here, however, the residual stresses preferably increase strongly towards the inside so that the effects described above can be achieved.

For a centrally lying region of the coating, i.e. not right on the outside and not right on the inside, a negative residual stress gradient, which is preferably smaller than the negative residual stress gradient in the inner region of the coating, i.e. lying towards the base material, has proved to be of value. In this way the residual stress lies with the highest level a comparably long way to the outside on the coating, and this allows one to expect favourable characteristics.

In particular with sliding elements for which one can expect an extremely high surface pressure, a constant low residual stress profile in an innermost region, i.e. directly against the base material, is favourable.

Furthermore, by means of a likewise constant, comparably low residual stress profile that is, however, preferably at a higher level than in the innermost region, and which is provided on the outside of the coating, the running-in characteristics can be further improved.

In order to avoid the spread of cracks in the coating, extensively alternating residual stresses in the middle region have proved to be advantageous. In connection with this, the extent of the zones with low residual stresses can be smaller than, equal to or greater than the extent of the zones with high residual stress.

For the periodicity, i.e. the thickness, between the start of a region with low residual stress, over a region with high residual stress to the start of the next region with low residual stress, values of 0.1 to 1 µm are conceivable.

Overall, by means of the measures described, coatings with a thickness of 10 µm or greater can be produced, the effect of which on the one hand is favourable running-in characteristics, but at the same time constitutes a sufficient layer thickness so as to ensure a long life span with favourable friction properties of the coating after unavoidable wear.

For the generation of the different residual stresses a change, for example, in the ratio between sp2 and sp3 hybridised carbon atoms is advantageous. In particular, the pressure residual stresses can be increased by increasing the sp3 portion, and this enables overall the formation of a residual stress gradient.

This applies similarly with an increasing density so that for a change to the density of the layer over the thickness of the latter it is expected to be possible to change the residual stresses advantageously over the thickness of the layer.

Finally, it has been considered to change the hardness of the layer over the thickness of the latter because a greater degree of hardness results in greater pressure residual stresses, and so in this way the desired residual stress gradients can also be set.

BRIEF DESCRIPTION OF THE DRAWINGS

In the following embodiments of the invention are described, as examples, in more detail with reference to the drawings. These show as follows.

DETAILED DESCRIPTION

In the figures the residual stresses of the DLC coating are respectively marked over the thickness of the coating, an outermost region of the coating lying on the left, and an innermost region of the coating on the right in the diagrams. In other words, the base material, for example steel or grey iron, adjoins the coating with the residual stresses shown on the right.

Figure 1:
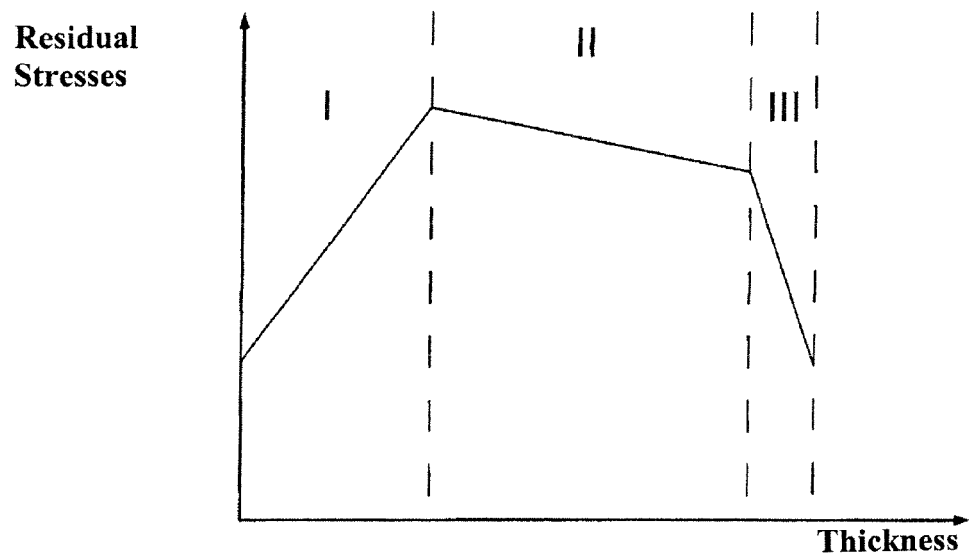
FIG. 1 an illustration of the residual stress profile over the thickness of a DLC coating in a first embodiment.

In the embodiment of FIG. 1 (from the outside to the inside) negative residual stress gradient is formed starting from the inner region or the "base" of the coating (zone III). In other words, the residual forces at the cross-over to the base material are particularly low in order to achieve a good stress cross-over and good adhesion of the coating. In a middle region (zone II) the residual stress increases further, but with a lower gradient, to the highest level. On the outside (zone I) the residual stresses decrease greatly, in other words a high positive residual stress gradient is formed from the outside to the inside, and this leads to favourable running-in characteristics.

Figure 2:
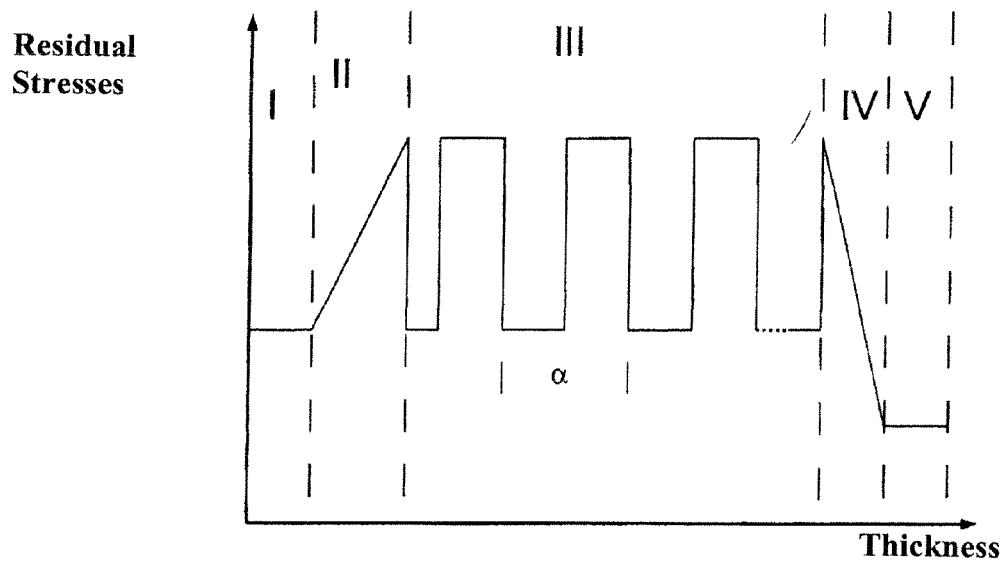
FIG. 2 an illustration of the residual stress profile over the thickness of a DLC coating in a second embodiment.

This applies in the same way to the embodiment of FIG. 2 in which in an outermost zone I the residual stresses are initially constant at a low level, and then (zone II) increase greatly. This provides a stress-dependant cross-over between zone I and a zone III in which the residual stresses alternate extensively. In particular, with thrust stress loading a constantly high residual stress state has proven to be at risk of cracks. The alternating residual stresses in zone III prevent the spread of cracks. In this region the periodicity α can be, for example, between 0.1 and 1 μm. Similarly to the embodiment of FIG. 1, a zone IV with a strongly negative residual stress gradient adjoins the base material (on the right in the figure), and directly adjacent to the base material there is a zone V with a constantly low residual stress profile in order to achieve a good stress cross-over to the base material and good adhesion. The residual stress level in zone V can in particular be lower than that in the outermost zone I, and in zone III the residual stresses can vary between absolute maximum values and a level a little above the level of zone I.

The invention claimed is:

1. A sliding element of an internal combustion engine, comprising:
   a base material; and
   a DLC coating consisting essentially of diamond-like carbon of the ta-C type applied to the base material and which has changing residual stresses over its thickness, the DLC coating including an inner residual stress gradient region, a middle residual stress gradient region, and an outer residual stress gradient region;
   the inner residual stress gradient region disposed between the base material and the middle residual stress gradient region, the inner residual stress gradient region having a residual stress which decreases over the thickness from the outside to the inside;
   the outer residual stress gradient region disposed between the middle residual stress gradient region and the outside of the sliding element, the outer residual stress gradient region having a residual stress which increases over the thickness from the outside to the inside; and
   the middle residual stress gradient region disposed between the inner and outer residual stress gradient regions, the middle residual stress gradient region having a residual stress which is alternating between a lower residual stress level, a higher residual stress level, and then a lower residual stress level over the thickness from the outside to the inside, wherein the higher residual stress level is greater than the lower residual stress level.

2. The sliding element according to claim 1, including innermost and/or outermost regions of the coating where the residual stresses are substantially constant.

3. The sliding element according to claim 1, including innermost and outermost regions of the coatings where the residual stresses are substantially constant and the residual stress of the innermost region is lower than the residual stress of the outermost region of the coating.

4. The sliding element according to claim 1, wherein the middle residual stress gradient region includes a plurality of first zones having the lower residual stress level and a plurality of the second zones having the higher residual stress level, the middle residual stress gradient region alternates between the first zones and the second zones, and the thickness between the start of one of the first zones and the end of the adjacent second zone is 0.1 to 1 μm.

5. The sliding element according to claim 1, wherein the coating is 10 μm or thicker.

6. The sliding element according to claim 1, wherein the coating includes sp2 and sp3 hybridized carbon atoms, and in at least one of the residual stress gradient regions there is a changing ratio between the amount of the sp2 hybridized carbon atoms and the amount of the sp3 hybridized carbon atoms over the thickness.

7. The sliding element according to claim 1, wherein the coating has a density, and in at least one of the residual stress gradient regions the density of the coating increases or decreases over the thickness.

8. The sliding element according to claim 1, wherein the coating has a hardness, and in at least one of the residual stress gradient regions the hardness of the coating increases or decreases over the thickness.

9. The sliding element according to claim 1, wherein the sliding element comprises a piston ring.

10. The sliding element according to claim 1, wherein the residual stress of the outer residual stress gradient region increases at a lower rate than the rate at which the residual stress of the inner residual stress gradient region decreases.

11. The sliding element according to claim 1, wherein the middle residual stress gradient region includes at least one first zone having the lower residual stress level and at least one second zone having the higher residual stress level, and the middle residual stress gradient region alternates between the zones.

12. The sliding element according to claim 11, wherein the middle residual stress gradient region includes a plurality of the first zones and a plurality of the second zones, and the middle residual stress gradient region alternates between the first zones and the second zones.

13. The sliding element according to claim 12, wherein the lower residual stress level is the same in each of the first zones, and the higher residual stress level is the same in each of the second zones.

14. The sliding element according to claim 12, wherein the lower residual stress level in at least one of the first zones is different from the lower residual stress level in at least one of the other first zones.

15. The sliding element according to claim 12, wherein the higher residual stress level in at least one of the second zones is different from the higher residual stress level in at least one of the other second zones.

16. The sliding element according to claim 12, wherein the lower residual stress level is constant over the thickness of each of the first zones, and the higher residual stress level is constant over the thickness of each of the second zones.

17. The sliding element according to claim 2, wherein the residual stress of the outermost region is greater than the residual stress of the innermost region.

* * * * *

UNITED STATES PATENT AND TRADEMARK OFFICE
CERTIFICATE OF CORRECTION

| | | |
|---|---|---|
| PATENT NO. | : 9,169,547 B2 | Page 1 of 1 |
| APPLICATION NO. | : 13/321261 | |
| DATED | : October 27, 2015 | |
| INVENTOR(S) | : Steffen Hoppe, Manfred Fischer and Marcus Kennedy | |

It is certified that error appears in the above-identified patent and that said Letters Patent is hereby corrected as shown below:

In the Specification:

In column 1, line 20, please delete the words "Prior Art".

Signed and Sealed this
First Day of March, 2016

Michelle K. Lee
*Director of the United States Patent and Trademark Office*